United States Patent [19]

Tran

[11] Patent Number: 5,397,920
[45] Date of Patent: Mar. 14, 1995

[54] LIGHT TRANSMISSIVE, ELECTRICALLY-CONDUCTIVE, OXIDE FILM AND METHODS OF PRODUCTION

[75] Inventor: Nang T. Tran, Lake Elmo, Minn.

[73] Assignee: Minnesota Mining and Manufacturing Company, St. Paul, Minn.

[21] Appl. No.: 217,425

[22] Filed: Mar. 24, 1994

[51] Int. Cl.$^6$ .................... H01L 23/48; H01L 29/40
[52] U.S. Cl. .................... 257/749; 257/448; 257/748; 257/102
[58] Field of Search ............. 257/749, 448, 99, 449, 257/748, 102

[56] References Cited

U.S. PATENT DOCUMENTS

| | | | |
|---|---|---|---|
| 2,682,927 | 2/1953 | Colbert et al. | 154/2.75 |
| 3,477,936 | 11/1969 | Gillery et al. | 204/192 |
| 3,506,556 | 4/1970 | Gillery et al. | 204/192 |
| 4,146,657 | 3/1979 | Gordon | 427/126 |
| 4,400,254 | 8/1983 | Freller et al. | 204/192.29 |
| 4,514,437 | 4/1985 | Nath | 427/39 |
| 4,623,601 | 11/1986 | Lewis et al. | 430/69 |
| 4,865,833 | 9/1989 | Saitoh et al. | 427/255.3 |
| 4,940,495 | 7/1990 | Weber et al. | 136/256 |
| 4,968,354 | 11/1990 | Nishiura et al. | 257/749 |
| 4,990,286 | 2/1991 | Gordon | 252/518 |
| 5,135,581 | 8/1992 | Tran et al. | 136/256 |

FOREIGN PATENT DOCUMENTS

| | | |
|---|---|---|
| 0382632 | 8/1990 | European Pat. Off. ............. 257/749 |
| 62-64007 | 3/1987 | Japan . |
| 63-55381 | 3/1988 | Japan . |
| 63-99418 | 4/1988 | Japan . |

OTHER PUBLICATIONS

Sarah R. Kurtz and Roy G. Gordon, *Transparent Conducting Electrodes on Silicon*, Solar Energy Materials 15 (1987) pp. 229–236.

Ishibashi et al., *J. Vac. Sci. Technol.* A 8(3) pp. 1399–1402 (May/Jun. 1990).

L. Vasanelli, A. Valentini and A. Losacco, *Preparation of Transparent Conducting Zinc Oxide Films By Reactive Sputtering*, Solar Energy Materials 16 (1987) pp. 91–102.

Minami et al, *Heat Treatment In Hydrogen Gas and Plasma For Transparent Conducting Oxide Films Such As ZnO, and $SnO_2$ and Indium Tin Oxide*, Thin Sold Films, 176 (1989) pp. 277–282.

G. L. Harding and B. Window, *DC Magnetron Reactively Sputtered Indium–Tin–Oxide Films Produced Using Argon–Oxygen–Hydrogen Mixtures*, Solar Energy Materials 20 (1990) pp. 367–379.

(Abstract) Isamukhamedova et al, Izv. Akad. Navk Uzb. SSR, Ser. Fiz.–Mat. Nauk (2) 67–8 (1982).

Primary Examiner—Jerome Jackson
Assistant Examiner—Donald L. Monin, Jr.
Attorney, Agent, or Firm—Gary L. Griswold; Walter N. Kirn; David B. Kagan

[57] ABSTRACT

A light transmissive, electrically conductive oxide comprising tin and a Group II element is doped with a Group III element and with one or more of hydrogen or fluorine. The oxide may be deposited by sputtering at a temperature in the range from 25° to 350° C., or by chemical vapor deposition at temperatures in the range from 80° to 400° C.

5 Claims, 1 Drawing Sheet

LIGHT TRANSMISSIVE, ELECTRICALLY-CONDUCTIVE, OXIDE FILM AND METHODS OF PRODUCTION

FIELD OF THE INVENTION

The present invention relates to detector devices such as photosensor devices and radiation detectors, and to light transmissive, electrically-conductive oxide films used in the production of these detector devices. The present invention further relates to processes of making these light transmissive, electrically-conductive oxide films.

BACKGROUND

Solar cells, photodiodes, radiation detectors and other optoelectronic devices utilize light-sensitive or radiation energy-sensitive materials (hereinafter energy-sensitive materials) that are capable of converting incident visible light or other radiation energy (e.g. x-rays, alpha rays and beta rays) into electrical energy. Light transmissive, electrically-conductive oxide films are frequently used in combination with these energy sensitive materials to allow incident light or radiation energy to pass through the film and strike the energy-sensitive material. In another application, such as with liquid crystal displays, electrically-conductive oxide films are used as light transmissive electrodes. In yet another application, light transmissive, electrically-conductive oxide films can be used as transparent resistors, for example, in window heaters or defrosters.

To be useful in the above applications, an oxide film must demonstrate a combination of features including transparency to visible light and electrical conductivity. Examples of well known and useful transparent conductive oxides are ZnO, $In_2O_3/SnO_2$, $In_2O_3$, $CdSnO_4$, SnO, and $SnO_2$.

It is known that properties of oxide films, particularly resistivity, can be enhanced by the inclusion of certain dopants. U.S. Pat. No. 4,623,601 (Lewis et al.) describes transparent, electrically-conductive zinc oxides doped with hydrogen or Group III elements. Films produced from these oxides exhibit reduced resistivity, and thereby are said to enhance the overall efficiency of photoconductive devices in which they are used.

However, researchers have also found that some of the enhanced conductive properties of these films are not stable over time. For instance, it has been shown that indium tin oxide (ITO) films deposited by reactive sputtering in the presence of $H_2$ and/or $O_2$ at relatively low temperatures (around 100° C. to 200° C.) suffer an increase in sheet resistivity over time when exposed to laboratory air at room temperature. G. L. Harding and B. Window, *DC Magnetron Reactively Sputtered Indium-Tin-Oxide Films Produced Using Argon-Oxygen-Hydrogen Mixtures*, 20 Solar Energy Materials 375 (1990).

Vasanelli el al., infra, report finding initial resistivity values of zinc oxide films deposited in $H_2$-Ar mixtures within the range from $10^{-3}$ to $10^1$ ohm cm, while zinc oxide films deposited in pure Ar had resistivities of about $10^2$ to $10^4$ ohm cm. Vasanelli et al. further report that when samples of their zinc oxide films were exposed to air at elevated temperatures (200° C.), the resistivity of the films increased. The resistivity of film samples deposited at higher $H_2$ concentrations suffered the most severe resistivity increases. L. Vasanelli, A. Valentini and A. Losacco, *Preparation of Transparent Conducting Zinc Oxide Films by Reactive Sputtering*, 16 Solar Energy Materials 91, 96–97 (1987).

To achieve greater stability, Vasanelli et al. performed post-deposition annealings of the oxide films. They report finding improved stability of zinc oxide films over time after exposing samples of the films to $N_2$ or $H_2$ at 200, 300, and 400° C. The greatest improvements were gained at the highest temperatures. Vasanelli et al. at 97.

U.S. Pat. No. 5,135,581 (Tran et al.) describes the achievement of increased stability without a post-deposition annealing step by sputtering a target in an atmosphere of fluorine-containing gas and a stabilizing gas such as $H_2$ or $H_2O$. Tran et al. describe a process for making transparent, conductive oxide films having decreased resistivity ($10-4$ to $10^{-2}$ ohm cm) and improved stability over time. Useful conductive oxides listed by Tran et al. are: ZnO optionally doped with Al, In, Ga, or B; SnO doped with at least one of F or Sb; indium tin oxide ($In_2O_3/SnO_2$); $CdSnO_4$; $TiO_2$ doped with F; and $SnTiO_3$.

U.S. Pat. No. 4,146,657 (Gordon) teaches that tin oxides doped with fluorine may be formed by forming a reactive vapor which will produce, upon heating, a compound having a tin-fluorine bond, and bringing this vapor to a heated surface, on which a fluorine-doped tin oxide deposits. Col. 3 lines 58–63. However, by this process, the heated surface is typically heated to temperatures of about 400° C. to 600° C. Col. 4 lines 34–35.

Exposing transparent conductive oxide films deposited on energy-sensitive materials to high temperatures (greater than about 400° C.), has several disadvantages. Disadvantages are that exposing the devices which utilize these oxide films (e.g. photosensors and radiation detectors) to high temperatures can cause migration of the oxide into the light sensitive material of the device, or migration of metals and dopants between layers of the energy sensitive film. Either of these effects can impair or destroy the device's ability to function. Furthermore, the high temperature process limits the useful substrates to those which will not undergo degradation at these elevated temperatures. Tran et al. '581 col. 1–2.

SUMMARY OF THE INVENTION

The present invention teaches that a light transmissive, electrically-conductive, oxide film comprising tin and a Group II element, and doped with a Group III element, and with at least one of hydrogen or fluorine exhibits improved optical and electrical properties which remain stable at elevated temperatures over time. These oxides can be produced without subjecting the films to the high temperatures required to produce other high quality tin oxide films. Because the present invention provides a relatively low temperature production process, films can be deposited on temperature-sensitive materials which would otherwise be damaged by exposure to the high temperatures typically required to produce a transparent, conductive tin oxide film. An improved property of the present films is their superior ability to transmit visible light, especially at short wavelengths, i.e. 400 nm. Additionally, because the new oxides display superior light transmissive properties (due to a small absorption coefficient), in combination with high electrical conductivity, films can be made relatively thicker in order to further reduce sheet resistance, yet at the same time light transmission will not be substantially decreased.

One aspect of the present invention is a light transmissive, electrically-conductive, oxide film. This film comprises tin and a Group II element, and is doped with hydrogen, fluorine, or both hydrogen and fluorine, and is also doped with a Group III element. Useful Group II elements are Zn and Cd or mixtures thereof. Group III element dopants which can be used are B, Al, Ga, In, and Tl or mixtures thereof.

Another aspect of the present invention is a process for depositing a light transmissive, electrically-conductive, oxide film onto a substrate by sputtering a target in an atmosphere comprising an inert gas and a hydrogen-containing gas and/or a fluorine-containing gas. The process results in the deposition onto a substrate of an oxide comprising tin and at least one Group II element, both usually derived from a sputtered target. The oxide film is doped with either hydrogen or fluorine, or with hydrogen and fluorine, either or both of which may be derived from the atmosphere, and is also doped with a Group III element which can be derived either from a target or another source.

A further aspect of the present invention is a process for making a light transmissive, electrically-conductive, oxide film by chemical vapor deposition by forming a gas and vapor mixture comprising an inert gas, a Group II element-containing compound, a tin-containing compound, an oxygen-containing compound, a Group III element-containing compound, and either a hydrogen containing gas, a fluorine-containing compound, or both a hydrogen and a fluorine-containing compound. The gas and vapor mixture is exposed to a heated substrate, resulting in the deposition on the substrate of a doped oxide film comprising tin derived from the tin-containing compound and a Group II element derived from the Group II element-containing compound. The oxide film is doped with either hydrogen derived from the hydrogen-containing gas or with fluorine derived from the fluorine-containing compound, or with both hydrogen derived from the hydrogen-containing gas and fluorine derived from the fluorine-containing compound, and is also doped with a Group III element derived from the Group III element-containing compound.

A further aspect of the present invention is a process for making a light transmissive, electrically-conductive oxide film, said process including an annealing step. Initially, a light transmissive, electrically-conductive oxide film is deposited by any suitable thin film technique. Subsequently, in an annealing step, the oxide film can be annealed at a temperature sufficient to increase the grain size of the film and thus improve its electrical properties, but not to a size large enough to substantially decrease the transmissivity of the film. The annealing step may be performed in an atmosphere comprising hydrogen, and/or fluorine, or in a plasma comprising hydrogen and/or fluorine.

A further aspect of the present invention is a detector device. The device includes a film comprising energy-sensitive material capable of generating an electrical signal upon exposure to electromagnetic radiation energy. At least one side of the energy-sensitive film is in electrical contact with a light transmissive, electrically-conductive layer. The device further includes connecting means in electrical contact with the light transmissive, electrically-conductive layer for connecting the detector device to an external circuit. The light transmissive, electrically-conductive layer is an oxide film comprising tin and a Group II element, said oxide film being doped with at least one Group III element, and with a dopant chosen from the group consisting of hydrogen and fluorine or mixtures thereof.

"Light transmissive," as used with regard to conductive oxide films, generally includes films which, at a thickness of about 5000 Å, are characterized as being capable of transmitting a majority of incident light between wavelengths of 500 and 800 nm. Some light transmissive oxide films of this thickness are capable of transmitting 80 to 90% of incident light between the wavelengths of 600 and 700 nm and, while most will transmit a majority of incident light between 400 and 500 nm, the transmissivity of many oxide films will decrease dramatically below 500 nm (see FIG. 1). The light transmissive characteristics of a film can be measured by a Lambda 9 spectrophotometer commercially available from Perkin-Elmer Co. This apparatus provides transmission, reflection, and absorption data in the wavelength range from 200 to 1000 nm.

As used in this specification, a "sputtering target," used in the process of sputtering is comprised of a metal or metal oxide material which, upon sputtering, produces precursors that are deposited as a film onto a substrate.

DESCRIPTION OF THE INVENTION

Figure 1:
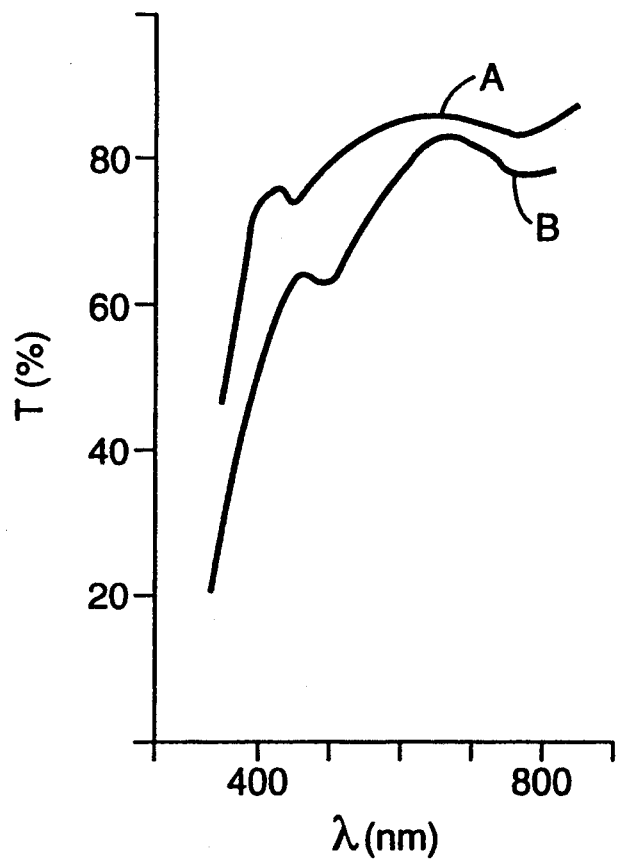
FIG. 1 is a graph comparing the approximate transmissivities of $SnO_2$:Sb (Denoted by A) and ZnSnO:Al:H:F (Denoted by B) between the wavelengths of about 400 and 800 nm.

Light transmissive, electrically-conductive oxides useful in the practice of the present invention comprise tin and a Group II element and are doped with a Group III element and at least one element selected from the group consisting of hydrogen and fluorine. Although zinc is the preferred Group II element, other Group II elements, particularly cadmium, would work as well. Alternatively, the Group II element may comprise a mixture of zinc and cadmium, with the weight ratio of Zn:Cd being in the range from 1:50 to 50:1. A preferred weight ratio of Sn:Group II element is in the range from about 1:2.0 to 20:1, and is most preferably in the range from about 1:10 to 1:1.

Group III elements suitable in the practice of the present invention include Al, B, In, Ga, Tl, and mixtures thereof, with the preferred Group III elements being Al and B. If the Group III element is a mixture of Al and B, then the preferred weight ratio of Al:B is in the range from about 1:20 to 20:1. The preferred weight ratio of Al, B, or mixtures thereof to (Group II element + Sn) is less than 3:100.

Hydrogen can be included as a dopant in the present invention to enhance and stabilize the electrical properties of the oxide. Hydrogen can be included according to the atomic ratio H:(Group II+Sn) within the preferred range from about 0.0001 to 0.1 and most preferably within the range from about 0.001 to 0.02. In the present invention hydrogen dopant can be used alone. However, hydrogen in combination with F provides for even further stabilizing of the properties of a transparent, electrically-conductive oxide film. The hydrogen and fluorine are preferably present in any H:F ratio from about 1:50 to 50:1.

Evaluations show that fluorine effectively enhances the stability of a transparent conductive oxide beyond what can be achieved with hydrogen doping alone. The desired atomic ratio of F:(Group II element+Sn) is in the range from about 0.0001 to 0.1, and the most preferred range is from about 0.001 to 0.02.

Transparent conductive oxide films have been produced by several known processes. See L. Vasanelli, A. Valentini and A. Losacco, *Preparation of Transparent Conducting Zinc Oxide Films by Reactive Sputtering*, 16 Solar Energy Materials 91 (1987) (evaporation, spray pyrolysis, and sputtering used in production of zinc oxide films); Sarah R. Kurtz and Roy G. Gordon, *Transparent Conducting Electrodes on Silicon*, 15 Solar Energy Materials 229 (1987) (using atmospheric pressure chemical vapor deposition to deposit a fluorine-doped tin oxide film onto silicon). The light transmissive, electrically-conductive oxides of the present invention can be deposited as films upon suitable substrates or energy-sensitive materials by suitable thin film deposition techniques. Useful substrates are, for example, glass and flexible substrates such as polyimide, KAPTON TM (from DuPont), Mylar polyester, stainless steel and others. As used in the present application the term "substrate" also includes energy sensitive materials which function as a component of a detector device. Where a post-deposition annealing step at temperatures up to or exceeding 400° C. is desired, low-cost glass, flexible stainless steel, or other materials which are thermally stable at or above this temperature can be used as substrates. Where a post-deposition annealing step is not performed, useful substrates may or may not be stable at temperatures exceeding the temperature at which deposition takes place.

The oxide film is deposited onto the substrate at a thickness sufficient to provide adequate electrical conductivity and transmissivity for use in optoelectronic devices. This conductivity is measured as sheet resistance, which is a function of film thickness. Generally a greater film thickness will provide a lower sheet resistance. The preferred thickness of the inventive oxide films is in the range from about 5000 Å to 1 micron.

Useful techniques for depositing the inventive oxide films are, for example, sputtering, reactive sputtering, chemical vapor deposition, plasma-enhanced chemical vapor deposition, E-beam evaporation, and laser evaporation. The oxides form on the substrate as a film having a granular morphology. The size of individual grains is related to deposition temperature, and can be measured by using a scanning electron microscope. Deposition of the film by any technique preferably occurs at a temperature sufficient to cause formation of a film having optimal grain size. An optimal grain size is a grain size large enough to provide a film having sufficient electrical conductivity, but not too large to reduce the film's transmissivity. Although conductivity and transmissivity are highly dependent on the composition of an oxide, generally a grain size of less than 200 Å will provide inadequate electrical conductivity. On the other hand, at a larger grain size (greater than 1 micron), the transmissivity of the film will suffer.

The light transmissive, electrically-conductive oxide films of the present invention can be deposited by sputtering suitable targets to produce precursors which will then be deposited onto a substrate. Sputtering can be carried out in an atmosphere of a gaseous and vaporous mixture (sputtering gas). The sputtering gas can be made up of an inert gas, a hydrogen-containing gas, a fluorine-containing gas and optionally $O_2$ or a Group III dopant-containing gas. The hydrogen-containing gas can be $H_2O$ vapor or $H_2$ or a mixture of $H_2O$ vapor and $H_2$. The inert gas is at least one inert gas such as argon, xenon, krypton, helium, or nitrogen. Suitable fluorine-containing gases are gases which comprise fluorine, such as $C_2F_6$, HF, $CF_4$, $CF_3Br$, hexafluoropropene, fluorocarbons and nitrogen trifluoride or mixtures thereof.

Reactive sputtering is the process of sputtering a metal target in the presence of gases, for example $O_2$, hydrogen-containing gases, fluorine-containing gases, and Group III element-containing gases. The oxygen is a necessary component of the sputtering gas, because it will react with the sputtered metal target and form an oxide film. A preferred metal target for reactive sputtering is Sn/Zn, and the sputtering preferably occurs at a temperature of 250° C. in the presence of argon. For the present invention, a preferred hydrogen-containing gas is $H_2$, and a preferred fluorine-containing gas is $CF_4$.

Depending upon whether the sputtering target is a metal or a metal oxide, the gaseous mixture can include different concentrations of $O_2$ gas. When a metal target is sputtered, the gaseous mixture includes sufficient $O_2$ to react with the sputtered metal to form an oxide film derived from the metal precursor, the gaseous oxygen, and optionally, other elements comprising the sputtering gas. On the other hand, when the sputtered target is a metal oxide, the amount of $O_2$ needed in the sputtering gas is much smaller. Some amount of $O_2$ is preferred even when the precursor is a metal oxide because a small amount of oxygen will be needed to control the stoichiometry of the oxide films.

During the sputtering process, Group III element dopants can be introduced for deposition into the oxide film either by inclusion of the Group III element as a dopant in the target or by means of Group III dopant-containing gases being present in the sputtering gas. For boron doping, useful gases are, for example, $B_2H_6$, $B_2F_6$, and $BF_3$, or mixtures thereof, with $B_2H_6$ being preferred. For aluminum doping, useful gases are, for example, tri-methyl or tri-ethyl aluminum or mixtures thereof. For indium doping, useful gases are indium-containing gases, for example, diethyl indium and dimethyl indium or mixtures thereof. For gallium doping, useful gases are gallium-containing gases, for example triethyl gallium and dimethyl gallium or mixtures thereof.

Sputtering targets suitable for producing the light transmissive, electrically-conductive oxides of the present invention can comprise tin and a Group II element, and can optionally be doped with a Group III element. Preferably, the target comprises tin and ZnO and is doped with a Group III element such as aluminum. Suitable oxide targets include commercially available oxide targets such as $SnO_2$, or $CdSnO_4$, as well as either ZnSnO, or CdO with Sn, doped with any Group III element useful in the practice of the present invention.

The particular substrate used in the practice of the present invention can vary widely and can be one of any materials which are useful as substrates for light transmissive, electrically-conductive oxide films. As one example, the light transmissive, electrically-conductive oxide films of the present invention can be sputtered onto a polymer web to form a polymer sheet with a conductive metal oxide surface. The polymer web can be, for example, a polyimide such as KAPTON TM from Dupont.

In another embodiment, the light transmissive, electrically-conductive oxide films of the present invention can be deposited to form a transparent electrode in devices such as photovoltaic devices, photodiodes, radiation detectors, and liquid crystal displays. In some of these applications the film can be deposited, for example, onto a glass substrate, or alternatively, the film can be deposited directly onto a layer of energy sensitive material.

A sputtering apparatus which has been found to be particularly useful in the practice of the present invention is the Perkin-Elmer Model 2400 Sputtering System. This apparatus consists basically of an air tight sputtering chamber which encloses an anode where the substrate will be mounted, a target acting as a cathode, and a shield to direct sputtered material toward the substrate. A power supply with a radio frequency of 13.56 MHz is connected to the cathode and the anode. Gas delivery lines deliver the sputtering gas to the sputtering chamber. This apparatus and the sputtering process are described in more detail in U.S. Pat. No. 5,135,581 (Tran et al.) col. 4–5, which description is incorporated herein by reference.

The sputtering process consists of an initial pumpdown of the sputtering chamber, a presputtering step, which effectively cleans the target, and finally the actual sputtering deposition step. During pumpdown the sputtering chamber is evacuated to a pressure of $10^{-3}$ torr using a mechanical pump. Next, a diffusion pump is used to evacuate the chamber to about $10^{-6}$ or $10^{-7}$ torr and then the system is filled with the sputtering gas at a pressure of 7 mTorr. In this atmosphere, presputtering occurs for approximately 30 minutes before the actual sputtering deposition step is begun. During the sputtering deposition step, the substrate temperature can be any temperature which allows the gaseous and vaporous mixture to be deposited upon the substrate at an optimal grain size. An optimal grain size will produce a film having an acceptably low resistivity, in combination with an acceptably high transmissivity. Preferably, the substrate temperature is within the range between ambient temperature (25° C.) and 350° C., and most preferably the substrate temperature is about 250° C.

The preferred sputtering gas comprises a mixture of argon and hydrogen gases, including $H_2$ at a concentration of about 5%. This mixture can be used in combination with a fluorine-containing gas, preferably $CF_4$. Alternative gas and vapor combinations which are useful are $H_2O$ vapor in combination with $C_2F_6$ or HF in $N_2$. The gases can be fed into the chamber separately, but they are preferably mixed and fed into the chamber in a single sputtering gas stream. The flow rate of this single gas stream can be about 30 standard cubic centimeters per minute (sccm) to give a film deposition rate of about 1 Å/sec, when sputtering a 10" diameter target at a power setting of 300 watts.

Another method of producing the inventive light transmissive, electrically-conductive oxide films is thermal chemical vapor deposition, or "thermal CVD." Advantages of thermal CVD over sputtering are that thermal CVD can be done at a faster rate and more uniformly over a larger area in order to produce a more uniform product in a more cost effective manner than is possible by sputtering.

Thermal CVD in terms of practicing the present invention is accomplished by initially producing a mixture of gases and vapors comprising an inert carrier gas, such as nitrogen or argon, and the elements of the oxide film to be deposited. Next, the mixture of gas and vapor is exposed to a heated furnace containing a heated substrate. The gases decompose inside the heated oven and are deposited onto the heated substrate in the form of a film. The temperature of the heated substrate is preferably in a range suitable to produce a film having optimal grain size. An optimal grain size will produce a film having an acceptably low resistivity in combination with an acceptably high film transmissivity.

To produce the inventive oxide film by thermal CVD, the gas and vapor mixture can comprise an inert carrier gas, a tin-containing compound, a Group II element-containing compound, an oxygen-containing compound, a Group III element-containing compound, and a $H_2$ gas and/or a fluorine-containing compound. The deposited oxide film is derived from the recited gas and vapor mixture, and preferably comprises tin and a Group II element, and is preferably doped with a Group III element, and one or more of hydrogen and fluorine.

When the Group II element is zinc, the useful Group II element-containing compounds are, for example, diethyl zinc, dimethyl zinc, triethyl zinc and trimethyl zinc or mixtures thereof. Useful tin-containing compounds are, for example tetramethyl tin, tetraethyl tin, dibutyl tin, dimethyl tin, tin dichloride, tin trichloride, and tin tetrachloride or mixtures thereof. Useful oxygen-containing compounds are, for example $O_2$, $H_2O$, and volatile alcohols or mixtures thereof. Useful volatile alcohols are, for example, isopropanol, ethanol, methanol, etc. The fluorine-containing compound can be chosen from the group including HF dispersed in $N_2$, HF dispersed in Argon, $CF_3Br$, and $C_2F_3Br$. Useful Group III element-containing compounds are, for example diethyl aluminum, $B_2H_6$, $B_2F_6$, and $BF_3$ or mixtures thereof.

In a preferred thermal CVD process of the present invention, tin tetrachloride ($SnCl_4$) is mixed with an inert gas such as Ar or $N_2$, which also contains a small amount of $H_2$. Similarly, HF is mixed with an inert gas, such as $N_2$, as a fluorine source. A preferred Group II element-containing compound is diethyl zinc. A source of a Group III dopant such as boron can be $B_2H_6$ or $B_2F_6$. Water vapor can be used for the oxygen source, which can be obtained by means of bubbling Ar or $N_2$ through a container of water.

The process of thermal CVD can be carried out either at atmospheric pressure, or at a reduced pressure (any pressure below atmospheric pressure). Preferably, the gas and vapor mixtures can be combined at a total pressure of about 1 Torr. The mixture of gas and vapor flows over the surface of a substrate, the substrate being heated to a temperature sufficient to allow deposition of the chosen gas and vapor mixture onto the substrate as a coated film having optimal grain size, as described above. The preferred temperature range for the substrate is between 80° C. and 400° C. For the preferred reactants of tin tetrachloride, diethyl zinc and either $B_2H_6$ or $B_2F_6$, the preferred temperature range is between 100° C. and 350° C. If a thermally-sensitive substrate is chosen, then the preferred reactants comprising the gas and vapor mixture should be chosen to exhibit appreciable reactivity at appropriately low temperatures.

In another embodiment of the present inventive process, the inventive light transmissive, electrically-conductive oxides can be formed by means of plasma-enhanced chemical vapor deposition. Plasma-enhanced CVD is similar to thermal CVD except that instead of using a heated furnace, a radio frequency (RF) power source is used to excite the plasma and to break up the referenced gases and vapors. The RF frequency can be anywhere within the range from 60 HZ to as high as 2.56 GHz. A standard RF frequency is 13.56 MHz.

In addition to the above described processes of producing the present inventive oxide films, other thin film technologies may be used, for example, the techniques of spraying, dipping, ion-beam sputtering, E-beam evaporation and laser evaporation.

In a further embodiment of the present inventive process, a post-deposition annealing step can be utilized to eliminate the presence of hydrogen and/or fluorine dopants during the deposition process, and at the same time enhance the crystallinity of the grains in the oxide films and adjust the grain size.

A process which includes a post-deposition annealing step can be accomplished by a multiple-step sequence. The first step is to deposit on a substrate, by means of a suitable thin film technique, a light transmissive, electrically-conductive oxide film comprising tin and a Group II element, the oxide film being doped with a Group III element. The second step is to anneal the oxide film in an atmosphere comprising hydrogen and/or fluorine at a process temperature sufficient to produce a film having optimal grain size, as described above. Preferably, the annealing temperature is within the range from 100° C. to 400° C., and most preferably the annealing temperature is around 350° C.

In a similar process, an oxide film can be deposited by a thin film technique, and subsequently annealed in a plasma which contains hydrogen and/or fluorine at a process temperature sufficient to produce a film having optimal grain size. Preferably, the process temperature is within the range from 100° C. to 400° C., and most preferably the process temperature is 350° C.

The light transmissive, electrically-conductive oxide films of the present invention can be useful as electrodes in many applications within, for example, radiation detectors and photosensor devices. The advantageous properties of the oxide film, as applied in the form of a transparent, conductive oxide layer, are high transparency and transmission of light for a given thickness, low resistivity, and stability of these properties over time. Since the absorption coefficient of the inventive oxides is relatively small, they can be used to make relatively thicker films, e.g., for use as electrodes, which will have reduced electrical sheet resistance, but without a corresponding reduction in light transmission.

Photosensor devices and radiation detectors (detector devices) of the present invention comprise a class of devices having an energy-sensitive film with two major sides, the film being made of material capable of generating an electrical signal upon exposure to light or other forms of radiation energy.

Figure 2:
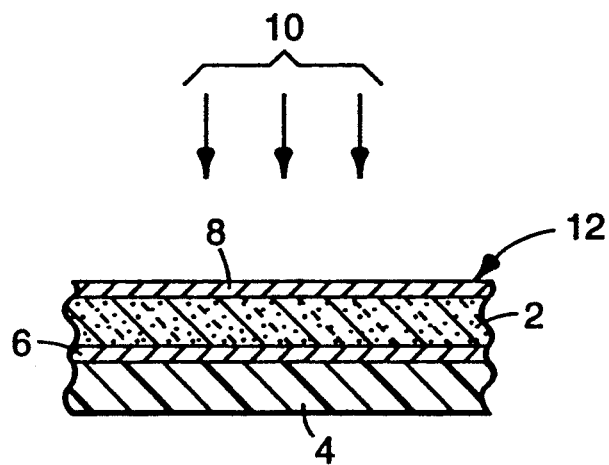
FIG. 2 shows an embodiment of the present invention suitable for use as a detector device.

FIG. 2 shows part of a detector device 12, comprising an energy-sensitive layer 2, a substrate 4, a first electrical contact 6, and a second electrical contact 8, each contact being in electrical contact with a major side of the energy-sensitive film. At least one of the electrical contacts 6 or 8 is a light transmissive, electrically-conductive oxide film comprising tin and a Group II element, said oxide film being doped with at least one Group III element, and with dopants chosen from the group consisting of hydrogen and fluorine or mixtures thereof. Electromagnetic radiation rays (visible light, x-rays, etc.), 10, pass through the light transmissive, electrically conductive oxide film, 8, and strike the energy-sensitive layer, 2, causing the energy-sensitive layer, 2, to generate an electrical signal. As an example of another embodiment, x-rays can pass through a phosphor layer (not shown) which generates light, the generated light then passes through oxide film 8, and strikes layer 2. An external circuit, (not shown), and connecting means (not shown) for connecting the electrical contacts 6,8, to the external circuit, can be included as part of the device.

Preferred energy sensitive films are, for example any of the following: a single layer of photoconductive material; a combination of three layers of semiconductors, including a p-type semiconductor, an intrinsic layer, and an n-type semiconductor; or a combination of a semiconductor layer (p-type or n-type) and a metal layer. Useful photoconductive materials are, for example, amorphous selenium, cadmium telluride, cadmium selenide, cadmium sulfide, mercury cadmium telluride, selenium-based alloys, telluride-based alloys, selenium telluride, hydrogenated amorphous silicon and alloys thereof and other materials known in the art to be sensitive to electromagnetic radiation. Useful semiconductor layers (n-type, p-type, and intrinsic) are, for example, hydrogenated amorphous silicon, or alloys thereof.

The thickness of the energy-sensitive layer may vary. For example, if the energy-sensitive layer is sensitive to visible light, the thickness can be in the range from 0.3 $\mu$m to 2 $\mu$m, and is preferably in the range from 0.6 $\mu$m to 1 $\mu$m. If the energy-sensitive layer is sensitive to radiation energy, the thickness of the photoconductive layer can be in the range from 50 microns to 1000 microns, and is preferably in the range from 200 microns to 500 microns.

The invention will now be described with reference to the following illustrative examples.

EXAMPLE 1

A light transmissive, electrically-conductive zinc-tin oxide film doped with hydrogen, fluorine, and aluminum, ZnSnO:H:F:Al (Compound A), was prepared using a reactive sputtering method. For comparison purposes, a second light transmissive, electrically-conductive zinc-tin oxide film, ZnSnO:H:Al (Compound B), was prepared in the same manner, to be identical to Compound A with the exception that Compound B was not doped with fluorine.

A Perkin Elmer Model 2400 Sputtering System was used to produce samples of each of compounds A and B. The system had a single deposition chamber equipped with a 13.56 MHz RF power source, a mechanical pump and a diffusion pump with a liquid nitrogen trap. Inside the chamber, the target was a disc 25.4 cm (10 in) in diameter comprising ZnO doped with about 1 weight % Al and mounted on a copper base. The ZnO was supplied by Demetron, Inc. of Sunnyvale, Calif. The target further comprised a Sn pellet about 2.54 cm (1 in) in diameter and 0.1 cm thick, which was prepared by melting Sn powder in a steel mold at 400° C. After cooling, the pellet was removed from the mold and mounted onto the ZnO target, near its center, using silver paste EPOTEK H20E from Epoxy Technology Incorporated.

Substrates (plates of Corning Glass #7095, 5.08 cm×5.08 cm (2"×2")) were mounted on a rotatable platform inside the sputtering chamber. The sputtering chamber was evacuated first by mechanical pump to a pressure of about $1\times10^{-3}$ torr. This was followed by evacuation using a diffusion pump for approximately 2 hours to a pressure of approximately $2\times10^{-6}$ torr.

To clean the target surface, pre-sputtering was conducted for 60 minutes by running the system at operating conditions with the shutter closed so that sputtered material was prevented from being deposited on the substrates. The sputtering process was then carried out at room temperature (25° C.) with 0.60 W/cm² target power density to give a deposition rate of 1 Å/sec. To prepare Compound A, a sputtering gas comprising a mixture of Ar and $H_2$ at a flow rate of 50 sccm and $CF_4$ at a flow rate of 1 sccm was introduced into the chamber to give $7\times10^{-3}$ torr of sputtering gas. The Ar-$H_2$ mixture, available with ultra high purity from Matheson Gas Co., comprised 5% $H_2$ by volume. The $CF_4$ flow was adjusted to give a $CF_4$:$H_2$ flow ratio of 0.5.

To prepare compound B, the gas flow comprised only the Ar-$H_2$ mixture at a flow rate of 50 sccm.

Each of the resulting oxide films of Compound A and Compound B was 5000 Å thick. Immediately after sputtering, each as-deposited film was measured for sheet resistance at room temperature using an ohm-meter. To evaluate the stability of the resistance, the films were then placed in an oven containing air at 180° C. for 60 hours. The films were removed periodically and the electrical resistance was measured. The results of those measurements are shown in the table below.

| Compound (dopants) | Sheet resistance, room temp [Ω/□] | Sheet resistance, [Ω/□] after exposure to 180° C. | | | |
|---|---|---|---|---|---|
| | | 1 hour | 2 hours | 10 hours | 60 hours |
| A (H, F, GIII) | 1000 | 1000 | 1100 | 2000 | 5000 |
| B (H, GIII) | 1000 | $5\times10^6$ | off scale | of scale | off scale |

Compound A, doped with fluorine, showed only minor increases in electrical resistance values over time, while the resistance of Compound B rose rapidly with exposure to heat and air, to values beyond the scale of the ohm-meter (the maximum reading was $10^8$).

EXAMPLE 2

With the following exceptions, the sputtering system and setup of Example 1 was used to produce a Sb-doped tin oxide compound, $SnO_2$:Sb (Compound C). The target of example 1 was replaced with a target of $SnO_2$ doped with 3% by weight Sb. The sputtering gas was a mixture of oxygen and Argon diluted with 5% $H_2$. Sputtering was carried out at a temperature of 25° C. to produce an oxide film 5000 Å thick. FIG. 1 shows that at a wavelength of 400 nm, the transmission of ZnSnO:Al:H:F is about 72% as compared to about 50% for $SnO_2$:Sb. FIG. 1 further shows that ZnSnO:Al:H:F displays superior transmissivity at all wavelengths between approximately 400 nm to 800 nm. Further, the as-deposited sheet resistance of $SnO_2$:Sb was $10^6$ Ω/□, or 3 orders of magnitude greater than that of ZnSnO:H:F:Al (Compound A) of Example 1.

EXAMPLE 3

By the same process of Example 1, 1 μm thick film samples of $ZnSnO_2$:Al:H:F and $SnO_2$:Sb were produced for comparison to each other and to the samples of 5000 Å thickness. With an increase of film thickness from 5000 Å to 1 μm, the transmission of visible light through the $ZnSnO_2$:Al:H:F film at a wavelength of 400 nm was reduced from approximately 72% to 70%. In contrast, an increase of the same film thickness caused the transmission of $SnO_2$:Sb to be reduced from approximately 50% to 40% at a wavelength of 400 nm.

What is claimed is:

1. A light transmissive, electrically-conductive oxide film comprising tin and a Group II element, said oxide film being doped with a Group III element and with a dopant selected from the group consisting of hydrogen, fluorine, and mixtures thereof.

2. The light transmissive, electrically-conductive oxide film of claim 1 wherein the Group III element is chosen from the group consisting of Al and B, or mixtures thereof.

3. A detector device comprising:
   a) a film comprising energy-sensitive material which generates an electrical signal upon exposure to electromagnetic radiation;
   b) a light transmissive, electrically-conductive layer in electrical contact with a side of said film; and
   c) connecting means in electrical contact with said light transmissive, electrically-conductive layer for connecting the device to an external circuit;
   wherein said light transmissive, electrically-conductive layer comprises an oxide comprising tin and a Group II element, said oxide being doped with a Group III element and with a dopant chosen from the group consisting of hydrogen, fluorine, and mixtures thereof.

4. The detector device of claim 3 wherein the energy-sensitive material is sensitive to visible light.

5. The detector device of claim 3 wherein the energy-sensitive material is sensitive to radiation energy.

* * * * *

UNITED STATES PATENT AND TRADEMARK OFFICE
CERTIFICATE OF CORRECTION

PATENT NO.: 5,397,920

DATED: March 14, 1995

INVENTOR(S): Nang T. Tran

It is certified that error appears in the above-identified patent and that said Letters Patent is hereby corrected as shown below:

Column 2, line 16, " 10-4 " should read -- $10^{-4}$ --.

Column 4, line 47, " 1:2.0 " should read -- 1:20 --.

Signed and Sealed this

Seventeenth Day of October, 1995

Attest:

BRUCE LEHMAN

Attesting Officer

Commissioner of Patents and Trademarks